United States Patent
Nakajima et al.

(10) Patent No.: US 7,750,232 B2
(45) Date of Patent: Jul. 6, 2010

(54) MULTI-CRYSTALLINE SILICON-GERMANIUM BULK CRYSTAL FOR USE AS A SOLAR CELL AND METHOD OF MAKING

(75) Inventors: Kazuo Nakajima, Miyagi (JP); Wugen Pan, Wakayama (JP); Kozo Fujiwara, Miyagi (JP); Noritaka Usami, Miyagi (JP)

(73) Assignee: Sumco Solar Corporation, Wakayama (JP)

( * ) Notice: Subject to any disclaimer, the term of this patent is extended or adjusted under 35 U.S.C. 154(b) by 727 days.

(21) Appl. No.: 11/176,389

(22) Filed: Jul. 8, 2005

(65) Prior Publication Data

US 2007/0006915 A1    Jan. 11, 2007

(51) Int. Cl.
*H01L 25/00* (2006.01)
(52) U.S. Cl. .................... 136/243; 136/261; 257/19; 438/1; 438/2
(58) Field of Classification Search .................. 136/243
See application file for complete search history.

(56) References Cited

U.S. PATENT DOCUMENTS

2002/0139416 A1    10/2002    Nakajima et al.

FOREIGN PATENT DOCUMENTS

JP    2002-289887    10/2002

OTHER PUBLICATIONS

Noritaka Usami, Kozo Fujiwara, Toro Ujihara, Gen Sazaki, Hiroyuki Yaguchi, Yoshihiro Murakami, Kazuo Nakajima, Control of Macroscopic Absorption Coefficient of Multicrystalline SiGe by Microscopic Compositional Distribution, Jan. 15, 2002, Jpn J Appl Phys, vol. 41, 37-39.*
A.S. Saidov, A. Kutlimratov, B. Sapaev, and U.T. Davlatov, Spectral and Current-Voltage Chracteristics of Si-Si1-xGex Heterostructures Grown by Liquid Phase Epitaxy, 2001, Technical Physical Letters, vol. 27 No. 4, pp. 319-322.*
K. Nakajima, et al., "Melt Growth of Multicrystalline SiGe with Large Compositional Distribution for New Solar Cell Applications", Solar Energy Materials & Solar Cells, 72 (2002), pp. 93-100.
K. Nakajima, et al., "Growth and Properties of SiGe Multicrystals with Microscopic Compositional Distribution for High-Efficiency Solar Cells", Solar Energy Materials & Solar Cells, 73 (2002), pp. 305-320.
W. Pan, et al., "Ge Composition Dependence of Properties of Solar Cells Based on Multicrystalline SiGe with Microscopic Compositional Distribution", Journal of Applied Physics, vol. 96, No. 2, Jul. 15, 2004, pp. 1238-1241.

* cited by examiner

*Primary Examiner*—Alexa D Neckel
*Assistant Examiner*—Xiuyu Tai
(74) *Attorney, Agent, or Firm*—Clark & Brody

(57) ABSTRACT

A multi-crystalline silicon germanium bulk crystal with microscopic compositional distribution is adapted for use in solar cells to substantially increase conversion efficiency. By controlling the average Ge concentration between 0.1 and 8.0 mole percent, significant improvements are attained with respect to short circuit current density and conversion efficiency.

4 Claims, 6 Drawing Sheets

Solar cell properties of multicrystalline Si and multicrystalline SiGe,
(a) *I–V* characteristic; (b) external quantum efficiency.

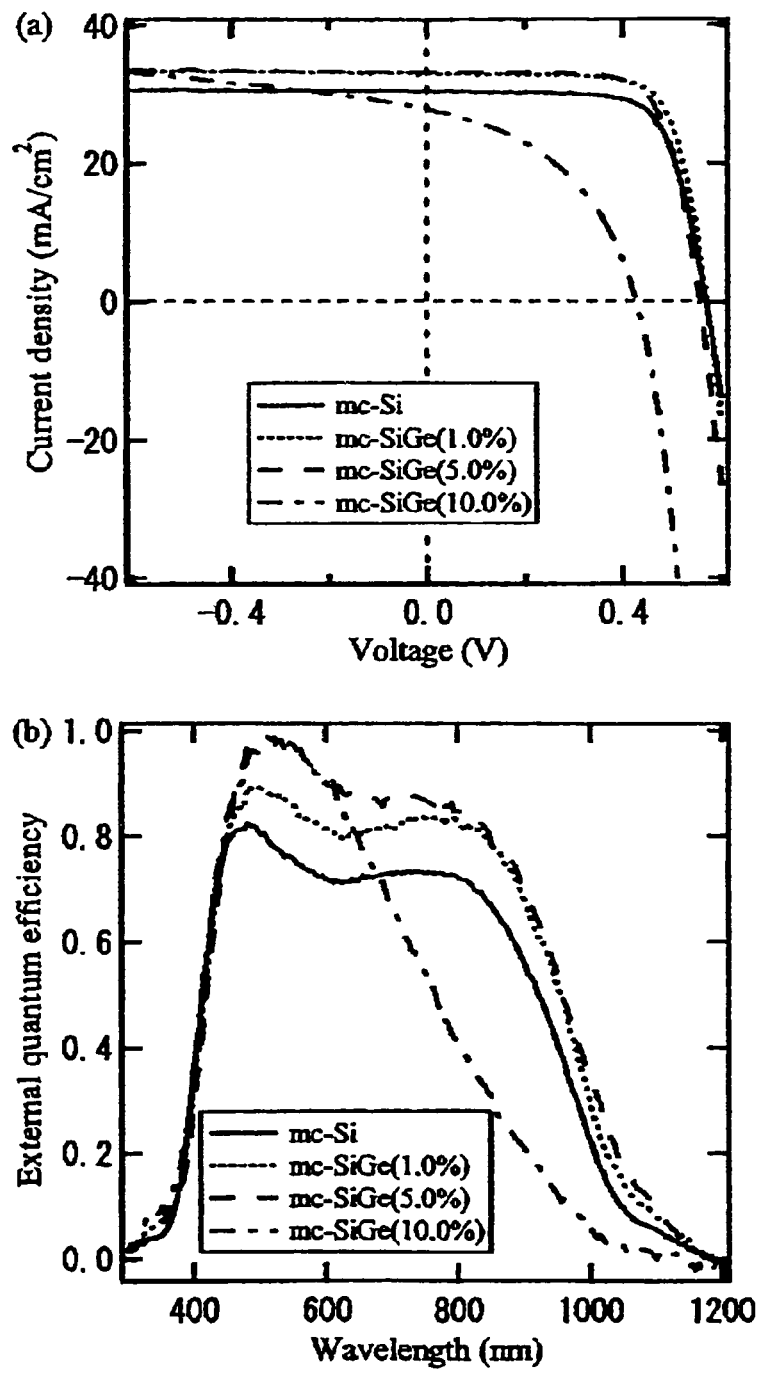
FIG. 1. Solar cell properties of multicrystalline Si and multicrystalline SiGe, (a) $I-V$ characteristic; (b) external quantum efficiency.

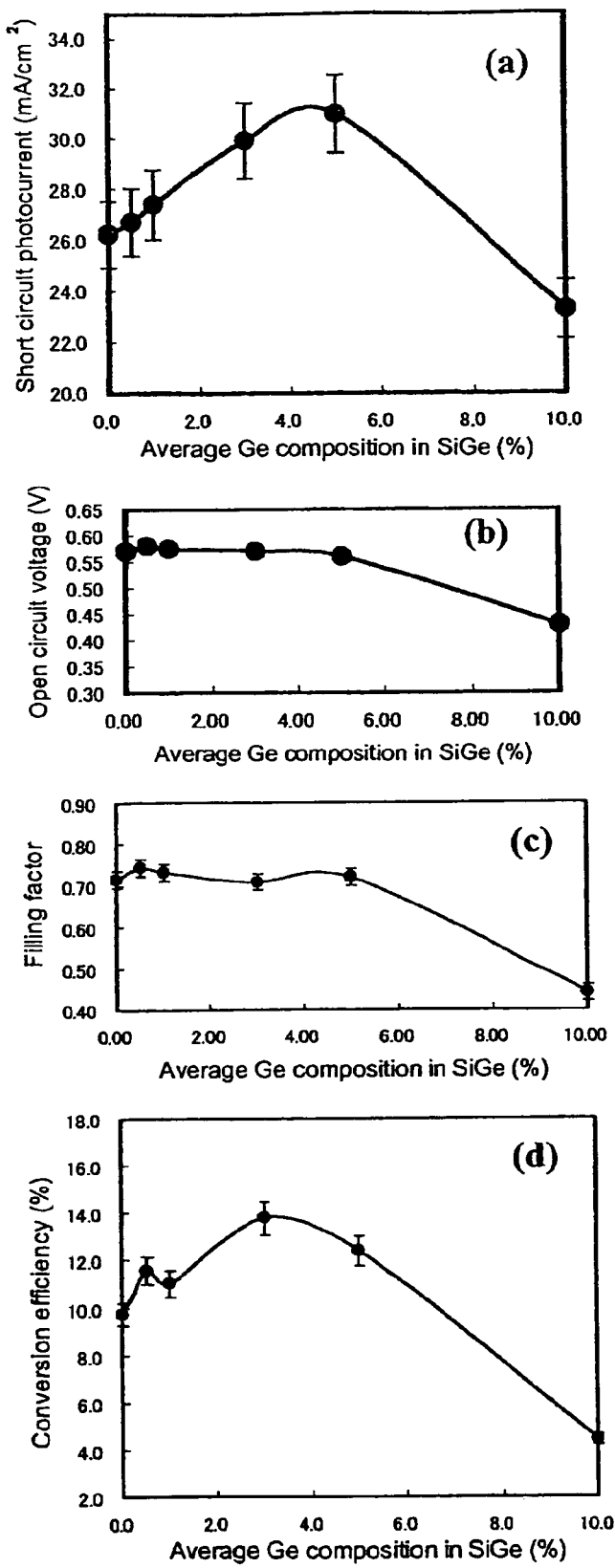
FIG. 2. Average Ge composition dependence of (a) current density of short circuit, (b) voltage of open circuit, (c) filling factor, and (d) conversion efficiency of multicrystalline solar cells.

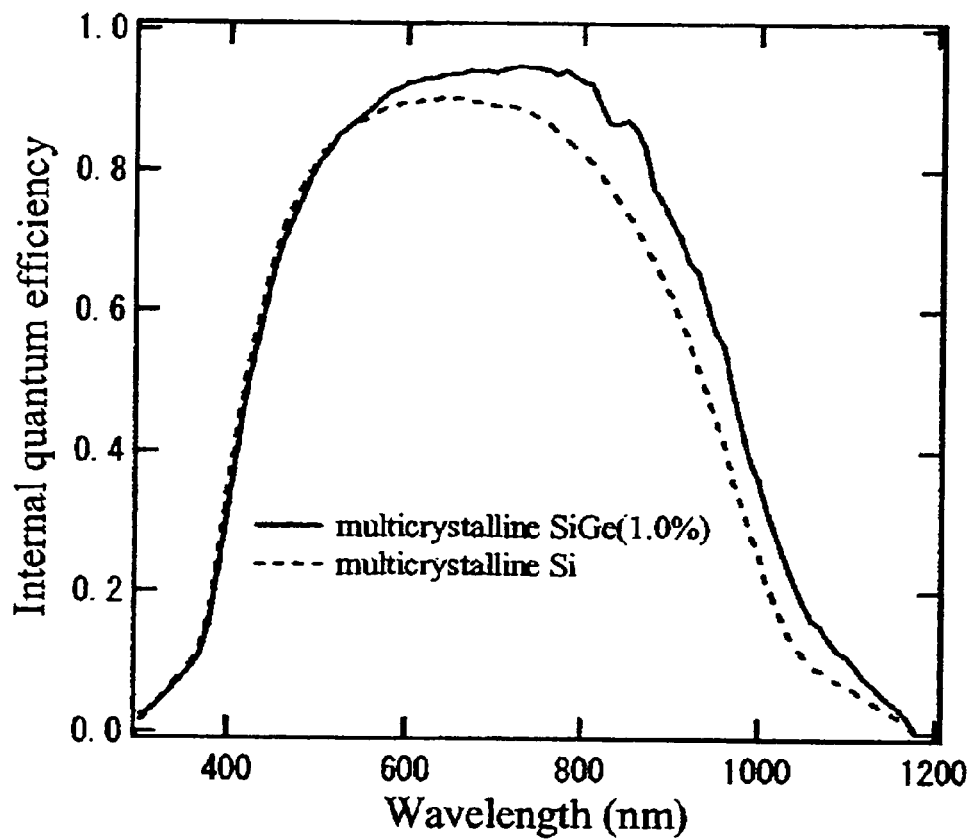
FIG. 3. Internal quantum efficiency of mc-SiGe (1.0%) and mc-Si solar cells.

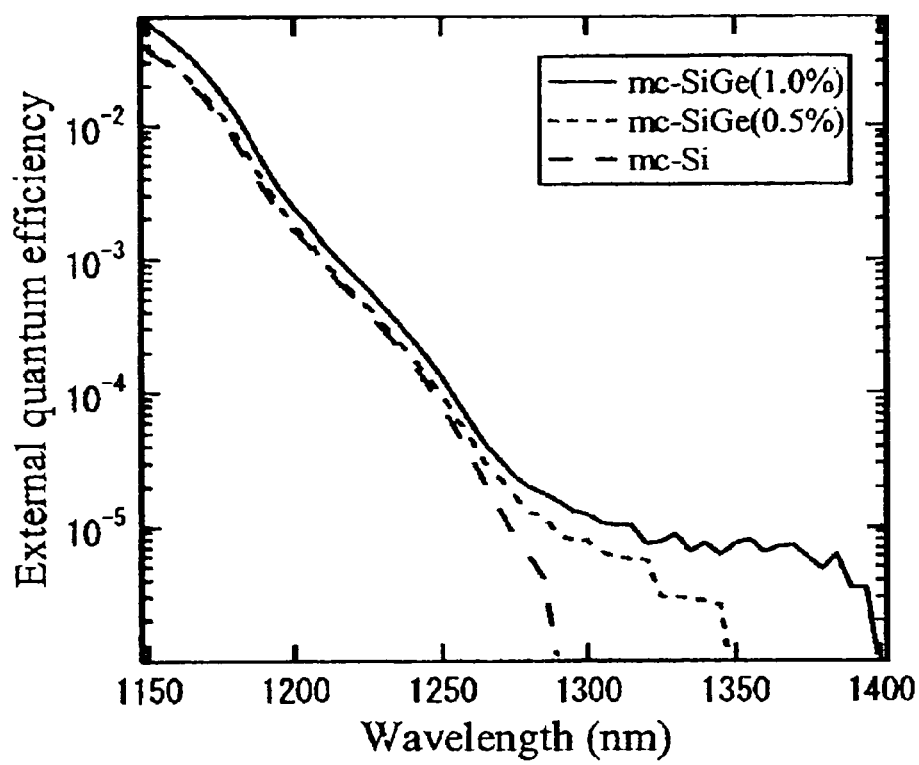
FIG. 4. External quantum efficiency of multicrystalline solar cells near the absorption band edge.

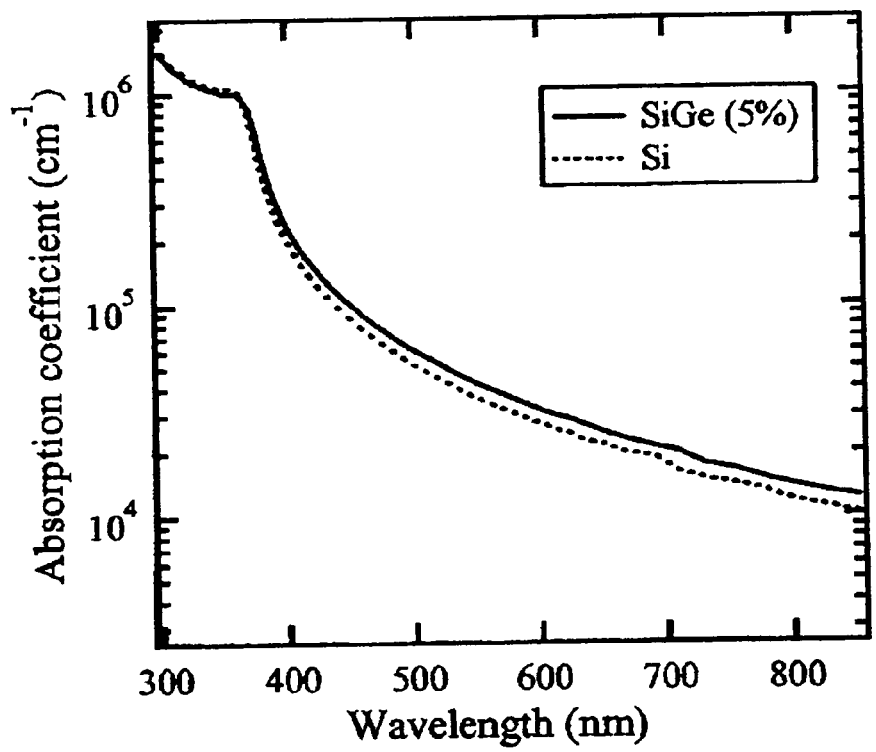
FIG. 5. Absorption spectra of multicrystalline SiGe (5%) and multicrystalline Si measured by spectroscopic ellipsometry.

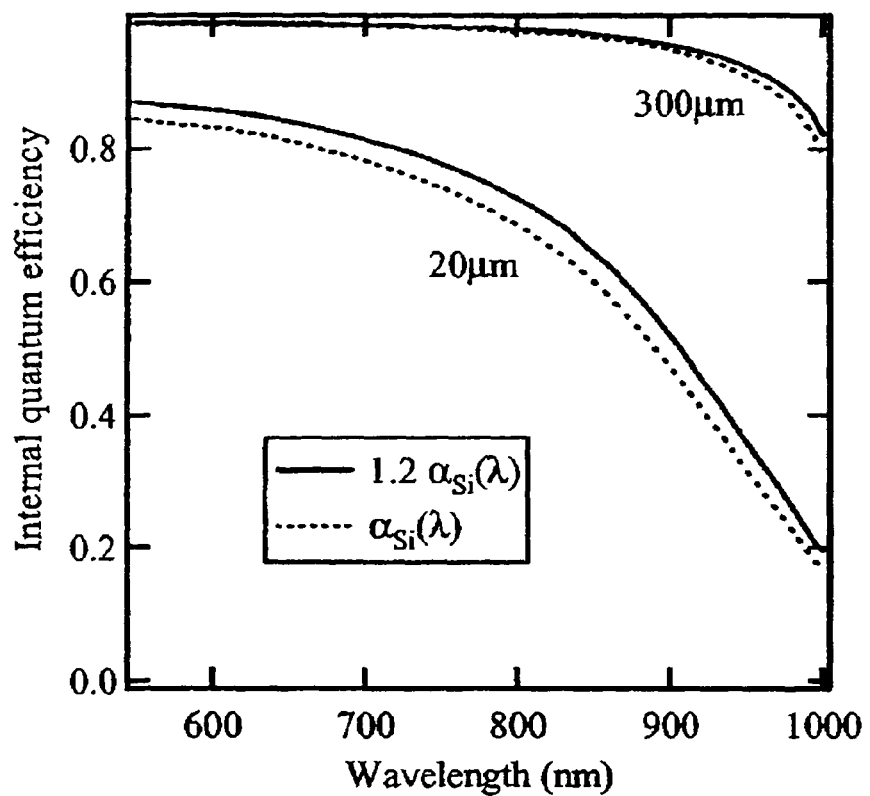
FIG. 6. Calculated internal quantum efficiency with absorption spectrum of Si and improved absorption spectrum by a factor of 1.2.

MULTI-CRYSTALLINE SILICON-GERMANIUM BULK CRYSTAL FOR USE AS A SOLAR CELL AND METHOD OF MAKING

TECHNICAL FIELD

The present invention relates to solar cells, and more particularly, to an improved mc-SiGe bulk crystal with a microscopic compositional distribution that has an average composition of germanium of between 0.1 and 8.0 mole percent.

BACKGROUND OF THE INVENTION

Solar photovoltaic modules, called "photovoltaics" or "PV", are solid-state semiconductor devices with no moving parts that convert sunlight into direct-current electricity. Crystalline silicon ("Si"), including mono-crystalline and multi-crystalline Si, accounts for about 85% of the annual PV shipments. In the last few years, multi-crystalline Si("mc-Si"), which can be grown by low-cost methods such as the casting method, has replaced mono-crystalline Si as the most dominant starting material for solar cells.

Although mc-Si has an advantage over mono-crystalline-Si in that it can be grown through cheaper, low-cost methods such as the casting method, there is a disadvantage to mc-Si. Specifically, the conversion efficiency of solar cells based on mc-Si is less than the conversion efficiency of solar cells based on mono-crystalline Si. It would be ideal to improve the conversion efficiency of mc-Si utilizing current processing technologies, without drastically increasing the production cost.

The prior art has recently proposed multi-crystalline SiGe with microscopic compositional distribution as a novel PV material. The fundamental idea is to non-uniformly disperse a small amount of Ge in mc-Si for controlling macroscopic physical properties, which are important for solar cells. In contrast to SiGe with uniform composition, which has been intensively studied for electronic applications, physical properties of mc-SiGe can be widely tuned by controlling the microscopic compositional distribution while fixing the average composition or concentration. United States Patent Publication No. 2002/0139416 to Nakajima et al. relates to such a multi-element poly-crystal having a non-uniform microscopic distribution that uses silicon and germanium, and this publication is herein incorporated in its entirety by reference.

Ideally, it would be possible to extend the onset of the absorption to the bandgap of Ge if pure Ge can be dispersed in mc-Si. If built-in strain is utilized, further reduction of the bandgap is expected to be possible. As a consequence, a drastic increase of the photocurrent due to the increased absorption of near-infrared light is expected. However, a drop of the open-circuit voltage cannot be avoided due to the increase of the intrinsic carrier concentration, as a result of the smaller bandgap of SiGe compared to that of Si.

Thus, there exists a need for further improvements in the field of solar cells, and in particular to solar cells made of mc-SiGe. The present invention solves this need by providing an improved solar cell via control of the average concentration of Ge in the multi-crystalline Si—Ge material.

SUMMARY OF THE INVENTION

A first object of the invention is to provide an improved and more efficient solar cell.

Another object of the invention is to provide a solar cell that is effective in increasing the short-circuit current density without affecting the open circuit voltage.

Yet another object of the invention is a solar cell containing silicon and germanium with a microscopic distribution that achieves higher conversion efficiency with drastic increase in production costs.

Other objects and advantages become apparent in light of the following description of the invention.

In satisfaction of the foregoing objects and invention, the present invention is an improvement in the field of multi-crystalline Si—Ge bulk crystals that have a microscopic composition distribution, particularly adapted for use in solar cells. Improvements in solar cell performance are realized by controlling the average germanium content of the material to between 0.1 mole % and 8.0 mole %, with a more preferred range being between 0.5 and 6.0 mole %. The inventive material is preferably made by known casting methods.

BRIEF DESCRIPTION OF THE DRAWINGS

FIG. 1 is a pair of graphs comparing the solar cell properties of mc-Si, mc-SiGe (1.0%), mc-SiGe (5.0%), and mc-SiGe (10.0%).

FIG. 2 is a set of four graphs showing the average Ge composition dependence of (a) current density of short circuit, (b) voltage of open circuit, (c) filling factor, and (d) conversion efficiency of multi-crystalline solar cells.

FIG. 3 is a graph showing the internal quantum efficiency of mc-SiGe (1.0%) and mc-Si solar cells across a wavelength spectrum.

FIG. 4 is a graph showing the external quantum efficiency of mc-SiGe (1.0%), mc-SiGe (0.5%), and mc-Si solar cells across a wavelength spectrum.

FIG. 5 is a graph comparing the absorption spectra of multi-crystalline SiGe (5.0%) and multi-crystalline Si measured by spectroscopic ellipsometry, across a wavelength spectrum.

FIG. 6 shows the calculated results for different diffusion length of the minority carrier of 20 and 300 µm, across a wavelength spectrum.

DETAILED DESCRIPTION OF THE PREFERRED EMBODIMENTS

As part of the present invention, solar cells were fabricated based on mc-SiGe and their device performance was investigated. The processing is detailed as follows.

The mc-Si and mc-SiGe were grown in 70-mm-diameter crucibles with a pulling rate of 0.2 mm/min by the casting method. Boron-doped single crystal substrates with a resistivity of 1-10Ω and non-doped Ge (>99.9999%) substrates were used as source materials. The microscopic composition of the mc-SiGe was not spatially uniform and was widely distributed, as confirmed by energy-dispersive x-ray analysis. In fact, the fluctuation around average composition amounted to ±20%-±50%, which is dependent on the input source composition of SiGe.

The crystals were cut to 1.5×1.5 $cm^2$ substrates after the growth, and then the substrates were mechanically polished to 400±µm thick with one side mirror surface. The substrates were chemically treated in 1 HF:6 $HNO_3$ solution for 1 min at 25° C., and then etched in buffered HF solution for 2 min at 25° C. before the solar cell process. The $n^+$ layer of the solar cell was formed by rapid thermal annealing at 950° C. for 30 min, after spinning a coating of phosphorus doped glass film [Ohka coat diffusion, or "OCD"].

The samples were then etched in buffered HF solution again to remove the residue of OCD film on the surfaces. An indium tin oxide (ITO with wt % $SnO_2$) film with 56 nm was formed as an antireflection (AR) film by sputtering. The back surface field contact was formed by printing the aluminum (Al) paste on the backside of the sample and annealing at 760° C., and the front finger contact was made by firing silver (Ag) paste through the ITO film at 760° C. The solar cell performance was measured using a characterization system (JASCOYQ-250BX) with light sources of AM1.5 solar simulator (100 mW/cm$^2$). A single crystal Si (with almost the same resistivity and thickness) solar cell fabricated with this process shows 12.3% conversion efficiency.

The average Ge composition dependence of the mc-SiGe solar cell performance was systematically investigated. All the cells were prepared with the same raw materials, same growth method, and same solar cell fabrication process.

FIGS. 1 and 2 show comparative studies for varying average composition of Ge in the solar cell material. FIG. 1 shows the solar cell properties of mc-Si, mc-SiGe (1.0%), mc-SiGe (5.0%) and mc-SiGe (10.0%). As shown in FIG. 1(b), the external quantum efficiencies in longer wavelengths of mc-SiGe, except mc-SiGe (10.0%), are higher than the external quantum efficiency of mc-Si.

FIG. 2 shows the average Ge composition dependence of (a) current density of short circuit ($J_{SC}$), (b) voltage of open circuit ($V_{OC}$), (c) filling factor, and (d) conversion efficiency ($\eta$) of the solar cells, respectively. The $J_{SC}$ drastically increases with the increasing of average Ge composition from 0.5% to 5% and abruptly decreases at the average Ge composition of 10%. Meanwhile, the $V_{OC}$ slightly decreases as theoretically calculated. The filling factors for most of the solar cells, except for the average Ge composition of 10%, are more than 0.70. Therefore, the drastic increase of the conversion efficiency is ascribed to the increase of $J_{SC}$ by introducing a small amount of Ge to mc-Si. For the 10% average Ge composition solar cell, the abrupt conversion efficiency decrease is due to many dislocations and defects involved in the crystal with the pulling rate of 0.2 mm/min during the growth.

It has been proposed in the prior art that mc-SiGe with microscopic compositional distribution could increase the absorption coefficient in longer wavelength regions and thus could increase the $J_{SC}$ of solar cells in longer wavelengths, and could finally give rise to higher conversion efficiency of Mc-SiGe solar cells compared to the conventional mc-Si solar cells. To drop the AR coating effect from the external quantum efficiency, we measured the internal quantum efficiency of the mc-Si and mc-SiGe solar cells.

FIG. 3 compares the internal quantum efficiency of the solar cells based on mc-SiGe (1.0%) with compositional distribution to mc-Si. FIG. 3 illustrates the remarkable increase of internal quantum efficiency in longer wavelengths for mc-SiGe solar cells. This increment gives rise to higher conversion efficiency for mc-SiGe solar cells with compositional distribution compared to that found in mc-Si solar cells.

FIG. 4 shows the external quantum efficiency of mc-Si solar cells, mc-SiGe solar cells with an average Ge composition of 0.5%, and mc-SiGe solar cells with an average Ge composition of 1.0%, near the absorption band edge. The mc-SiGe solar cells with the average Ge composition of 0.5% have the response in the longer wavelength region up to 1.35 μm. The mc-SiGe solar cells with the average Ge composition of 1.0% have the response up to 1.40 μm. Finally, the mc-Si solar cells have the response shorter than 1.28 μm. Although this extended longer wavelength response near the band edge does not contribute so much to the increment of the conversion efficiency of solar cells, it does support the idea that mc-SiGe with microscopic compositional distribution can increase the absorption coefficient in the longer wavelength region. This data suggests that the solar cell based on mc-SiGe has a potential for further improvement of the conversion efficiency by effectively utilizing the longer wavelength region of the solar spectrum.

The original concept behind mc-SiGe solar cells was to utilize the solar spectrum, which is transparent to Si, for improvement of the photocurrent. However, as shown in FIG. 4, the quantum efficiency in the spectral region $\lambda > 1.2$ μm was not largely improved, and the overall current density is negligible. On the other hand, the quantum efficiency in the shorter wavelength region was improved by the small addition of Ge, which led to the increase of the overall efficiency with increasing average Ge composition up to 5%.

Generally speaking, two possible explanations for the improvement of the internal quantum efficiency in the shorter wavelength region could be the increase of lifetime of the minority carrier, or an increase in the absorption coefficient. The former might play a role if a small addition of Ge somehow results in the improvement of the crystal quality. However, measurements of the lifetime by time-resolved reflectivity showed that the minority carrier lifetime of mc-SiGe is equivalent or even smaller than that of mc-Si. Therefore, the increase of the absorption coefficient is likely to explain the experimental results.

FIG. 5 compares absorption coefficients of mc-Si and mc-SiGe with average Ge composition of 5% measured by spectroscopic ellipsometry. It shows that the small addition of Ge is effective to increase the absorption coefficient in the wide spectral region. Typically, the absorption coefficient of mc-SiGe at the wavelength of 600-800 nm was found to be 1.2 times larger that that of mc-Si.

To clarify whether the increase of the absorption coefficient can explain the experimental results, a simple calculation of the internal quantum efficiency was carried out by solving one-dimensional, steady-state continuity equations. In addition to the Si solar cell, a solar cell based on an imaginary material with an absorption coefficient 1.2 times larger than that of Si was calculated. FIG. 6 shows the calculated results for different diffusion lengths of the minority carrier of 20 μm and 300 μm. When the quality of the starting material is excellent (for the case of the longer diffusion length), the internal quantum efficiency was not largely affected by the difference of the absorption coefficient. On the other hand, with decreasing diffusion length, the impact of the increase of the absorption coefficient became significant as observed in the experiments.

FIG. 6 shows that the mc-SiGe solar cell is technologically important since it improves the device performance of the mc-Si solar cell with a starting material of moderate crystal quality by increasing the absorption coefficient. Since the low-cost material is preferable for the starting material of the solar cell, the technique to introduce a small amount of Ge is a promising technique to improve the conversion efficiency for solar cells based on crystalline Si that are not high quality.

The data demonstrates that mc-SiGe solar cells with microscopic compositional distribution have higher efficiency than mc-Si solar cells with uniform composition, mainly due to the increase of the total photocurrent by a factor of 1.2 without an affect on the open-circuit voltage. The increment of short-circuit photocurrent of mc-SiGe solar cells with microscopic compositional distribution is due to the increased absorption coefficient. These results imply that such SiGe solar cells with microscopic compositional distribution are a very promising candidate for new solar cells with higher efficiency, which can be grown, for instance, by the practical low-cost casting method.

The relationship of silicon and germanium in the inventive multi-crystalline solar cell can also be characterized by $Si_xGe_{1-x}$, wherein x ranges between 0.999 and 0.92, and more preferably between 0.995 and 0.94. It should also be understood that while specific casting parameters have been disclosed to make the multi-crystalline silicon-germanium bulk crystal having a microscopic compositional distribution and an average composition of between 0.1 and 8.0 mole % of the invention, the parameters could vary as would be known in the art as part of the casting method. Further, the material of the invention could be made by any known methods that would produce the desired microscopic composition distribution as discussed above in accordance with the invention and the known prior art with casting as a preferred method.

Of course, various changes, modifications and alterations from the teachings of the present invention may be contemplated by those skilled in the art without departing from the intended spirit and scope thereof. It is intended that the present invention only be limited by the terms of the appended claims.

We claim:

1. A multi-crystalline silicon-germanium bulk crystal, the multi-crystalline silicon-germanium bulk crystal having a microscopic compositional distribution and an average composition of germanium of between 0.5 and 5.0 mole % and a resistivity of 1-10Ω cm, wherein a fluctuation in an average composition of the crystal amounts to ±20-50%.

2. A solar cell made from the bulk crystal of claim 1.

3. In a method of making a multi-crystalline silicon-germanium bulk crystal by casting, the multi-crystalline silicon-germanium bulk crystal having a microscopic compositional distribution and being cast, the improvement comprising making the bulk crystal with an average composition of germanium of between 0.5 and 5.0 mole % and a resistivity of 1-10 Ωcm, wherein a fluctuation in an average composition of the crystal amounts to ±20-50%.

4. The method of claim 3, wherein the bulk crystal is used as a solar cell.

* * * * *